United States Patent
Kim et al.

(10) Patent No.: US 8,551,307 B2
(45) Date of Patent: Oct. 8, 2013

(54) SPUTTERING TARGET APPARATUS (75) Inventors: Do-Hyun Kim, Seongnam-si (KR);
Dong-Hoon Lee, Seoul (KR);
Chang-Oh Jeong, Suwon-si (KR)

(73) Assignee: Samsung Display Co., Ltd., Yongin (KR)

( * ) Notice: Subject to any disclaimer, the term of this patent is extended or adjusted under 35 U.S.C. 154(b) by 399 days.

(21) Appl. No.: 12/779,459

(22) Filed: May 13, 2010

(65) Prior Publication Data
US 2011/0031117 A1    Feb. 10, 2011

(30) Foreign Application Priority Data
Aug. 7, 2009    (KR) .................. 10-2009-0072844

(51) Int. Cl.
*C23C 14/34*    (2006.01)

(52) U.S. Cl.
USPC ................... 204/298.12; 204/298.21

(58) Field of Classification Search
USPC ................................ 204/298.21
See application file for complete search history.

(56) References Cited

U.S. PATENT DOCUMENTS

| | | | |
|---|---|---|---|
| 2006/0006064 A1* | 1/2006 | Tepman | 204/298.12 |
| 2006/0065524 A1* | 3/2006 | Newcomb et al. | 204/298.21 |
| 2006/0266639 A1* | 11/2006 | Le et al. | 204/192.1 |

FOREIGN PATENT DOCUMENTS

| | | | |
|---|---|---|---|
| JP | 2007-119824 | | 5/2007 |
| JP | 2007119824 A | * | 5/2007 |
| KR | 2006-0029124 | | 4/2006 |
| KR | 2006-0049986 | | 5/2006 |

OTHER PUBLICATIONS

Yamakawa, Tetsuo, "Sputtering cathode target assembly for optical instrument, has target material substance whose peripheral surface target material substance is processed into cylindrical shaped structures", Oct. 26, 2005, JP2007119824A, machine translation.*

* cited by examiner

*Primary Examiner* — Keith Hendricks
*Assistant Examiner* — Timon Wanga
(74) *Attorney, Agent, or Firm* — H.C. Park & Associates, PLC (57) ABSTRACT

A sputtering target apparatus is provided. The sputtering target apparatus includes a first target assembly including a first target array having a first target, a second target disposed adjacent to the first target, and a first target dividing region disposed between the first and second targets, the first target assembly extending along a first direction, wherein the first target dividing region has a longitudinal cross-section that is oblique with respect to the first direction.

21 Claims, 10 Drawing Sheets

SPUTTERING TARGET APPARATUS

CROSS REFERENCE TO RELATED APPLICATION

This application claims priority from and the benefit of Korean Patent Application No. 10-2009-0072844, filed on Aug. 7, 2009, which is hereby incorporated by reference for all purposes as if fully set forth herein.

BACKGROUND OF THE INVENTION

1. Field of the Invention

Exemplary embodiments of the present invention relate to a sputtering target apparatus, and more particularly, to a sputtering target that allows the deposition of a uniform film.

2. Discussion of the Background

Thin films are formed on a substrate such as glass or plastic using metal oxides and ceramic materials as well as metals. In particular, Indium Tin Oxide (ITO) films that are a mixture of Indium oxide ($In_2O_3$) and tin oxide ($SnO_2$) have been mostly used as electrodes for flat panel displays including Liquid Crystal Display (LCD), Plasma Display Panel (PDP), and Organic Electroluminescent Display (OEL).

These electrode films are formed by sputtering using a sputtering target apparatus. For the sputtering target apparatus, a planar target assembly and a rotary target assembly have been proposed.

An increased surface area of glass or plastic substrates has resulted in an increase in the length of a target containing a film-forming material in a target assembly. However, as a target length increases, a method of manufacturing a target assembly has posed a limitation. That is, if a target is formed of a brittle ceramic oxide, an increase in the length of the target may cause damage to a ceramic material in the target.

To overcome such a limitation, a conventional target assembly including a plurality of targets and bonding agents connecting between the plurality of targets was proposed.

However, the conventional target assembly has a drawback in that electrical characteristics of a thin film formed by sputtering are found to vary across the thin film due to uneven distribution of materials of the bonding agent within the thin film. Thus, there is a need to develop a sputtering target apparatus that allows uniform distribution of materials of a bonding agent within a thin film formed by sputtering or prevents incorporation of materials of the bonding agent into the thin film.

SUMMARY OF THE INVENTION

Exemplary embodiments of the present invention provide a sputtering target apparatus that allows even dispersion of materials of a bonding agent within a thin film formed by sputtering.

Exemplary embodiments of the present invention also provide a sputtering target apparatus designed to prevent incorporation of materials of the bonding agent into a thin film formed by sputtering.

Additional features of the invention will be set forth in the description which follows, and in part will be apparent from the description, or may be learned by practice of the invention.

An exemplary embodiment of the present invention discloses a first target assembly including a first target array having a first target, a second target disposed adjacent to the first target, and a first target dividing region disposed between the first target and the second target. The first target assembly extends along a first direction, wherein the first target dividing region has a longitudinal cross-section that is oblique with respect to the first direction.

An exemplary embodiment of the present invention also discloses a sputtering target apparatus comprising a first target assembly including a first target array having a first target, a second target disposed adjacent to the first target, and a first target dividing region disposed between the first target and the second target. The first target array extends along a first direction, wherein the first target dividing region includes two boundaries, and a length of a path between the two boundaries is greater than a thickness of the first target and a thickness of the second target.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the principles of the invention.

DETAILED DESCRIPTION OF THE ILLUSTRATED EMBODIMENTS

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure is thorough and will fully convey the scope of the invention to those skilled in the art. Like reference numerals in the drawings refer to like elements throughout the specification. In the drawings, the size and relative sizes of layers and regions may be exaggerated for clarity.

It will be understood that when an element or layer is referred to as being "on" or "connected to" another element or layer, it can be directly on or directly connected to the other element or layer, or intervening elements or layers may be present. In contrast, when an element is referred to as being "directly on" or "directly connected to" another element or layer, there are no intervening elements or layers present. As used herein, the term "and/or" includes any and all combinations of one or more of the associated listed items.

Spatially relative terms, such as "below," "beneath," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures.

Exemplary embodiments of the present invention are described herein with reference to cross-section illustrations that are schematic illustrations of idealized embodiments (and intermediate structures) of the present invention. As such, variations from the shapes of the illustrations as a result, for example, of manufacturing techniques and/or tolerances, are to be expected. Thus, exemplary embodiments of the present invention should not be construed as limited to the particular shapes of regions illustrated herein but are to include deviations in shapes that result, for example, from manufacturing.

A sputtering target apparatus according to embodiments of the present invention will be more fully described below with reference to the accompanying drawings.

A sputtering target apparatus according to a first exemplary embodiment of the present invention will now be described with reference to FIG. 1, FIG. 2, FIG. 3, FIG. 4, and FIG. 5.

Figure 1:
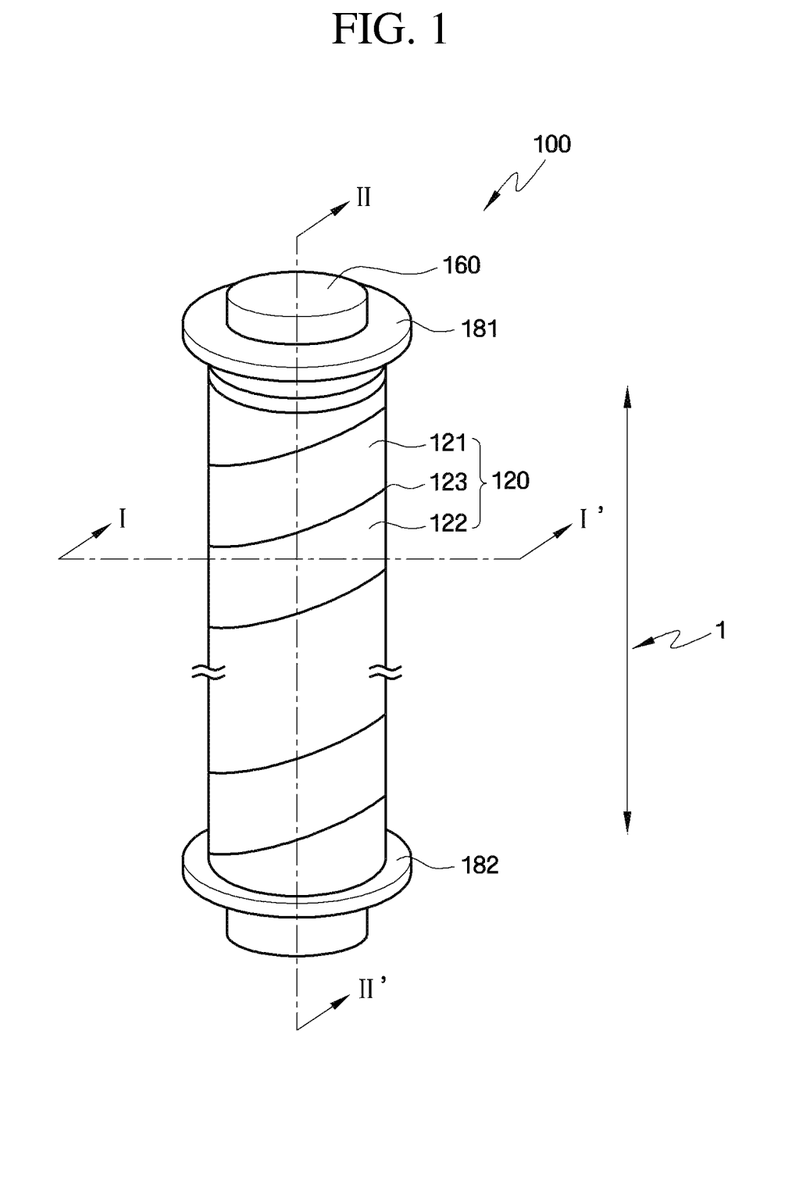
FIG. 1 is a perspective view of a first target assembly in a sputtering target apparatus according to a first exemplary embodiment of the present invention.
Figure 2:
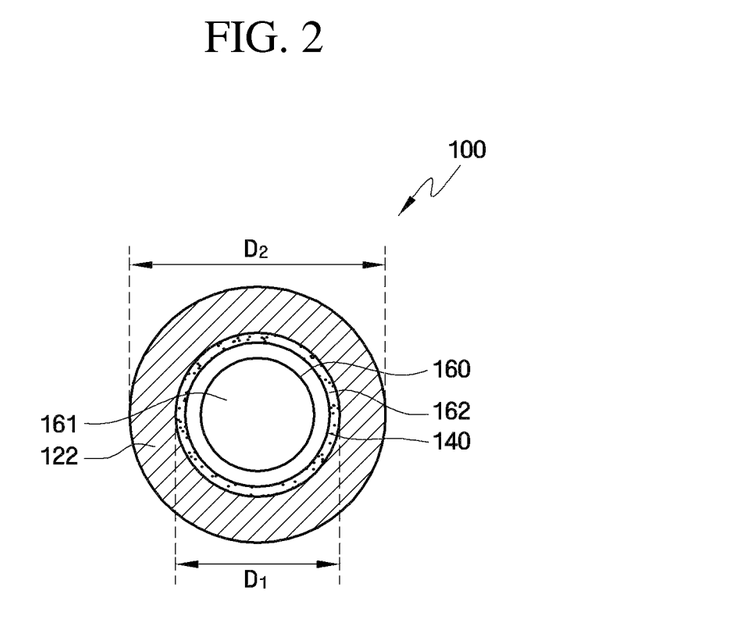
FIG. 2 is a cross-sectional view taken along line I-I' of FIG. 1.
Figure 3:
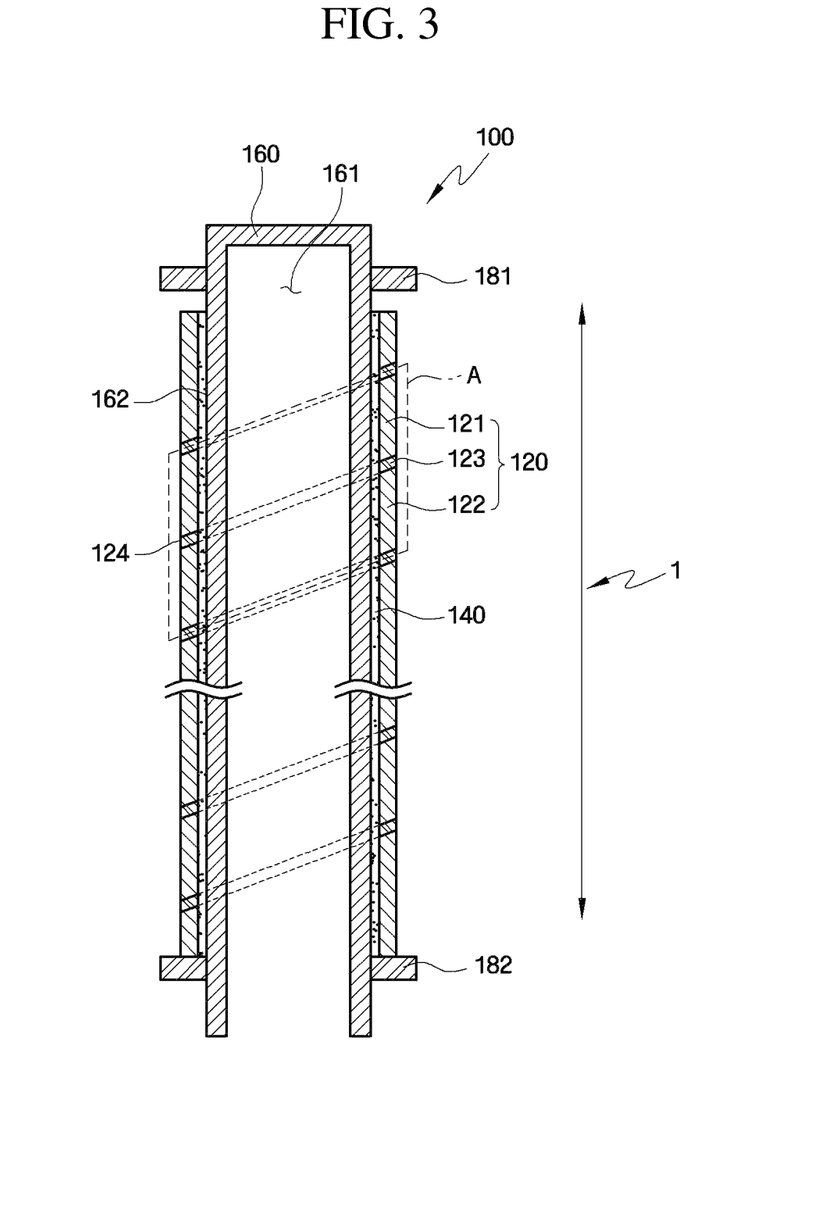
FIG. 3 is a cross-sectional view taken along line II-II' of FIG. 1.
Figure 4:
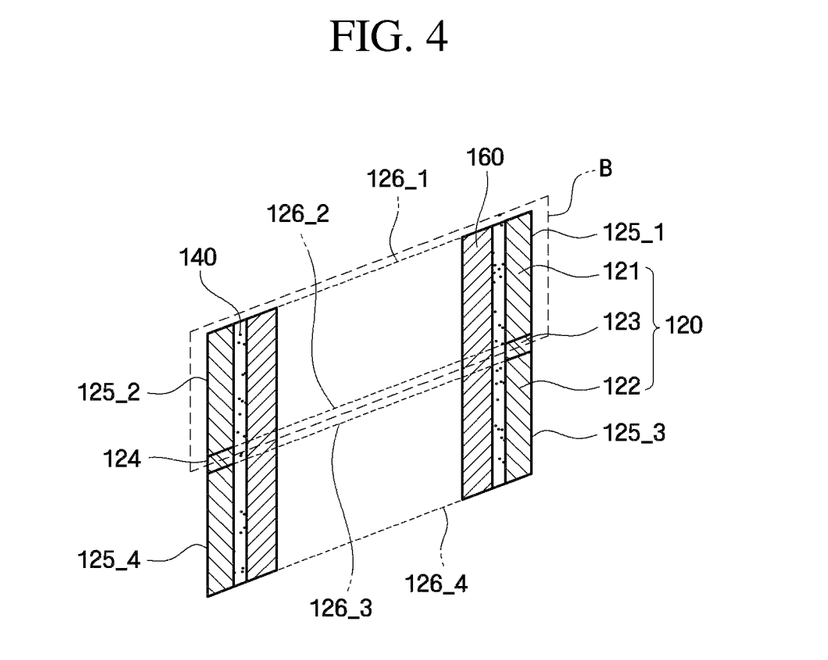
FIG. 4 is an enlarged view of portion "A" of FIG. 3.
Figure 5:
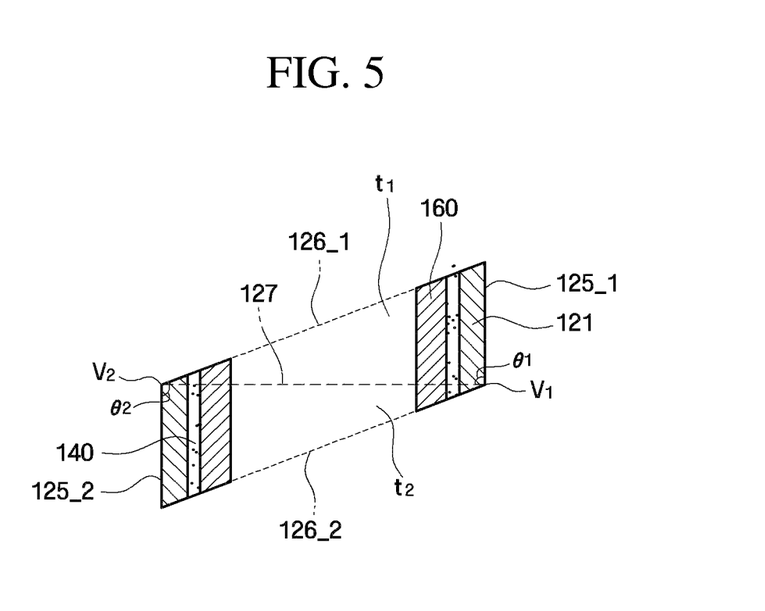
FIG. 5 is an enlarged view of portion "B" of FIG. 4.

FIG. 1 is a perspective view of a first target assembly in a sputtering target apparatus according to the first exemplary embodiment of the present invention, FIG. 2 is a cross-sectional view taken along line I-I' of FIG. 1, FIG. 3 is a cross-sectional view taken along line II-II' of FIG. 1, FIG. 4 is an enlarged view of portion "A" of FIG. 3, and FIG. 5 is an enlarged view of portion "B" of FIG. 4.

Referring to FIG. 1, FIG. 2, and FIG. 3, a first target assembly 100 in the sputtering target apparatus according to this embodiment includes a rotary roller 160, a first target array 120, and a cooling member 140 disposed between the first target array 120 and the rotary roller 160.

The rotary roller 160 supports and rotates the first target array 120 disposed about the outer circumference of the first target assembly 100. The rotary roller 160 may have a shape of a cylinder having a hollow inner space.

For example, the rotary roller 160 may be shaped of a hollow cylinder having both ends open or closed by the same element. As shown in FIG. 1, the rotary roller 160 may be shaped of a hollow cylinder having one end open and the other end closed. In other configurations, the rotary roller 160 may be shaped of a hollow cylinder having cylindrical outer and inner circumferences. In addition, the rotary roller 160 may have a polygonal cross-section for at least one of the outer and inner circumferences. However, the configurations of the rotary roller 160 are not limited to the illustrated examples and may have other various configurations.

The hollow rotary roller 160 may have magnetic bars around the inner circumference thereof when being assembled to the target sputtering apparatus. Water or other coolant may flow around the magnetic bars.

The rotary roller 160 may have an external diameter less than an internal diameter of the first target array 120 so as to provide a clearance for inserting the cooling member 140 between the rotary roller 160 and the first target array 120.

The rotary roller 160 may be formed of a highly thermally conductive material to facilitate transfer of heat generated in the first target array 120 thereto through the cooling member 140. The rotary roller 160 may also be made of a sufficiently high stiffness so as to provide a reliable mechanical structure. Examples of materials that satisfy the above requirements include metals such as stainless steel, copper, titanium, and aluminum.

The first target array 120 includes a first target 121, a second target 122, and a first target dividing region 123 disposed between the first target 121 and the second target 122. The first target array 120 extends along a first direction 1 and is affixed along the outer circumference of the rotary roller 160. The entire first target array 120 may include a plurality of targets. In this case, the target dividing region 123 divides between one target and its neighboring target. By using the target array 120 including the first target 121 and the second target 122, the present invention can provide a target array having a length suitable for a large-area substrate. For example, by using a plurality of Indium Tin Oxide (ITO) targets 121 and 122, the ITO target array 120 may have a length that is suitably adjusted for a large-area substrate according to the manufacturing process and characteristics of equipment.

Figure 9:
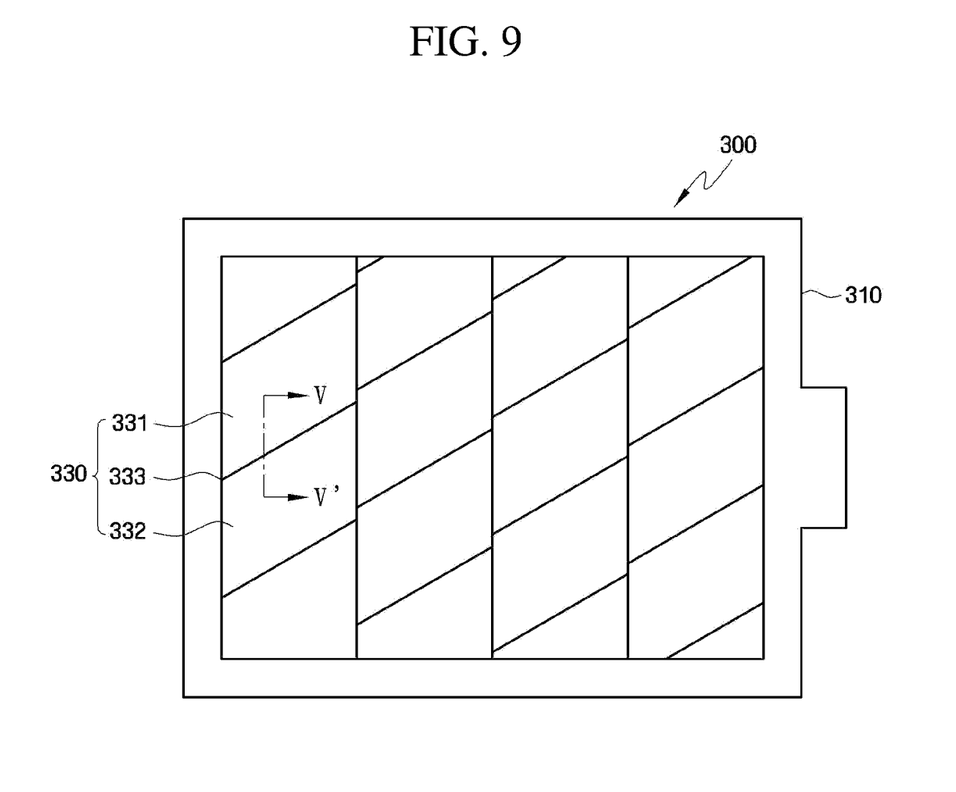
FIG. 9 is a plan view of a target assembly including first and second parallelogram-shaped targets, in a sputtering target apparatus according to another exemplary embodiment of the present invention.

The first target array 120 may be shaped of, for example, a hollow cylinder. However, if the first target array 120 is not a planar array as shown in FIG. 9, the first target array 120 may have other various shapes. For example, an inner circumference of the first target array 120 has a cross-sectional shape corresponding to that of an outer circumference of the rotary roller 160. Referring to FIG. 2, the first target array 120 has a circular transversal cross-section with respect to the first direction 1, but not limited thereto.

Each of the first target 121 and the second target 122 in the first target array 120 may include oxide containing at least one metal selected from the group consisting of Zn, In, Ga, and Sn. For example, each of the first target 121 and the second target 122 may include oxide, such as ITO, ZnO, $InGaZnO_4$, Zn—In—O, and Zn—Sn—O. Materials contained in the first target 121 and the second target 122 may be selected according to a thin film material to be deposited, but not limited thereto.

The first target 121 and the second target 122 may be produced by sintering. For example, if each of the first target 121 and the second target 122 includes ITO, each of the first target 121 and the second target 122 may be prepared by mixing indium oxide ($In_2O_3$) and tin oxide ($SnO_2$) at a ratio suitable for electrode characteristics, performing Cold Isostatic Pressing (CIP) on the mixture, and sintering the resulting product.

The length of the first target array 120 may be variously adjusted according to the area of a substrate on which sputtering is carried out. In this case, the length of the first target array 120 may be determined depending on the sintering process and characteristics of a fabrication apparatus. Each of the first target 121 and the second target 122 may have an internal diameter $D_1$ that is greater than an external diameter of the rotary roller 160 to which the first target 121 and the second target 122 are affixed. Each of the first target 121 and the second target 122 may also have an external diameter $D_2$ that will vary depending on the size of the sputtering apparatus used.

Referring to FIG. 3 and FIG. 4, the first target dividing region 123 has an oblique longitudinal cross-section with respect to the first direction 1. That is, the longitudinal cross-section of the first target 121 is at an angle with respect to the first direction 1. The first target dividing region 123 includes a bonding agent 124 that is used to attach the first target 121 and the second target 122 to each other. Indium may serve as the bonding agent 124. Since the longitudinal cross-section of the first target dividing region 123 is oblique with respect to the first direction 1, it is possible to prevent the bonding agent 124, for example, indium (In), from being unevenly deposited on the substrate by sputtering using the first target array 120. That is, the sputtering apparatus according to the present invention allows materials contained in the first target 121, the second target 122, and the bonding agent 124 contained in the first target dividing region 123 to be deposited uniformly across the substrate, thereby achieving deposition of a film with uniform electrical characteristics.

Referring to FIG. 3, FIG. 4, and FIG. 5, the longitudinal cross-section of the first target 121 with respect to the first direction 1 includes a first boundary 125_1 and a second boundary 125_2 that are located on the outer circumference of the first target 121. A non-rectangular parallelogram is formed by joining the respective ends of the first boundary 125_1 and the second boundary 125_2 to a first virtual line 126_1 and a second virtual line 126_2. In this case, the parallelogram is divided into two triangles t1 and t2 by a virtual dividing line 127 connecting one vertex $V_1$ of the parallelogram with the opposing vertex $V_2$. If the angle θ1 between the virtual dividing line 127 and the first boundary 125_1 and the angle θ2 between the virtual dividing line 127 and the second boundary 125_2 are 90°, the two triangles t1 and t2 are right triangles. If the cross-section of the first target 121 is divided into two right triangles t1 and t2 by the virtual dividing line 127 in this way, materials for the first target 121 and the first target dividing region 123 can be deposited evenly over the entire surface of a substrate on which materials for the first target array 120 will be deposited without a need to move the substrate during sputtering.

Similarly, the longitudinal cross-section of the second target 122 with respect to the first direction 1 includes a third boundary 125_3 and a fourth boundary 125_4 that are located on the outer circumference of the second target 122. Like in the first target 121, the respective ends of the third boundary 125_3 and the fourth boundary 125_4 are joined to a third virtual line 126_3 and a fourth virtual line 126_4 to create a parallelogram.

Thus, since the longitudinal cross-section of the first target dividing region 123 is oblique with respect to the first direction 1, materials contained in the first target 121, the second target 122, and the bonding agent 124 contained in the first target dividing region 123 can be deposited uniformly over the entire surface of the substrate.

Alternatively, the first target and the second target (331 and 332 in FIG. 9) may have a planar parallelogram shape. Thus, each of the first target 331 and the second target 332 may have a substantially parallelogram shape in its longitudinal cross-section with respect to the first direction 1. Thereby, despite the use of the planar-shaped first target 331 and the planar-shaped second target 332, it is also possible to deposit materials in the first target 331, the second target 332 and a bonding material in a first target dividing region (333 in FIG. 9) uniformly over the substrate.

The cooling member 140 in the first target assembly 100 is interposed between the first target array 120 and the rotary roller 160 without being bonded using a separate heat treatment and affixes the first target array 120 to the rotary roller 160. The cooling member 140 also transfers heat generated in the first target array 120 to the rotary roller 160.

The cooling member 140 may have higher thermal conductivity than the first target array 120, a large specific surface area, and absorb a strain induced by thermal expansion and contraction. The cooling member 140 may also be insusceptible to thermal expansion/contraction within itself. The cooling member 140 may include lubricating thermosetting resin and a metal having higher thermal conductivity than the first target array 120.

The thermosetting resin allows the first target array 120 to be in contact with the rotary roller 160, thereby preventing the first target array 120 from idling.

A highly thermally-conductive metal can transfer heat generated in the first target array 120 during sputtering toward the rotary roller 160 through the cooling member 140, thereby facilitating cooling. That is, the cooling member 140 with thermal conductivity that is higher than the first target array 120 but lower than or equal to the rotary roller 160 facilitates heat transfer from the first target array 120 to the rotary roller 160. Examples of the metal include, but are not limited to, aluminum (Al), molybdenum (Mo), copper (Cu), and stainless steel (SUS) having excellent thermal conductivity.

Referring to FIG. 1, FIG. 2, and FIG. 3, the first target assembly 100 further includes a top support ring 181 and a bottom support ring 182.

The bottom support ring 182 is affixed, for example, welded, to the outer circumference of the rotary roller 160 and sustains a load of the first target array 120. The bottom support ring 182 has an internal diameter greater than the external diameter of the rotary roller 160.

The top support ring 181 is affixed to the outer circumference of the rotary roller 160 such that it is spaced apart from the first target array 120 to permit lengthwise expansion of the first target array 120. If elements in the first target assembly 100 are stacked upside-down for sputtering, the top support ring 181 may also serve as the bottom support ring 182. The top support ring 181 has an internal diameter greater than the external diameter of the rotary roller 160. The rotary roller 160 may mate with a screw thread on an inner circumference of the top support ring 181.

The first target array 120 is disposed around the rotary roller 160 and supported by the bottom support ring 182.

Bonding of the first target assembly 100 includes disposing the first target array 120 around the rotary roller 160, interposing the cooling member 140 between the first target array 120 and the rotary roller 160 to the height of the first target array 120, and leaving the resulting structure at room temperature until the cooling member 140 is hardened.

In this case, a gap between the bottom support ring 182 and the first target array 120 is taped to prevent leakage of the cooling member 140. A heat resistant tape may be used for taping.

A sputtering target apparatus according to another exemplary embodiment of the present invention will now be described in detail with reference to FIG. 6, FIG. 7, and FIG. 8.

Figure 6:
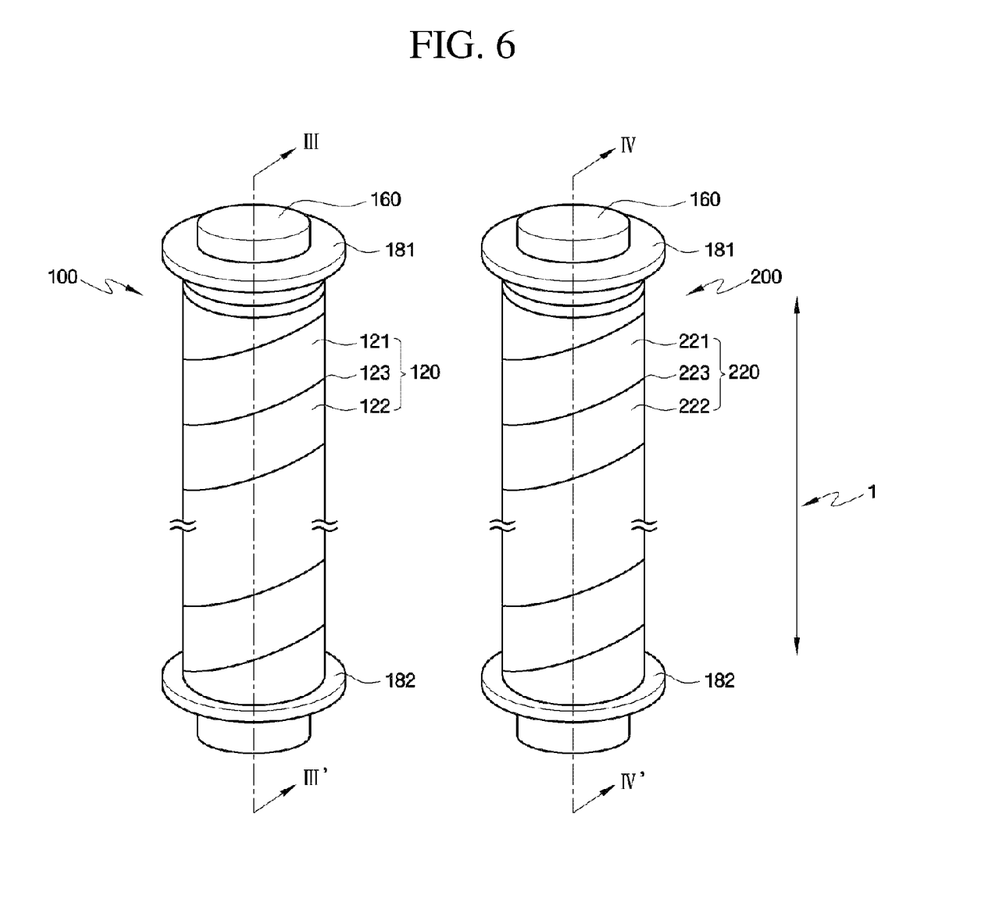
FIG. 6 is a perspective view showing first and second target assemblies in a sputtering target apparatus according to another exemplary embodiment of the present invention.
Figure 7:
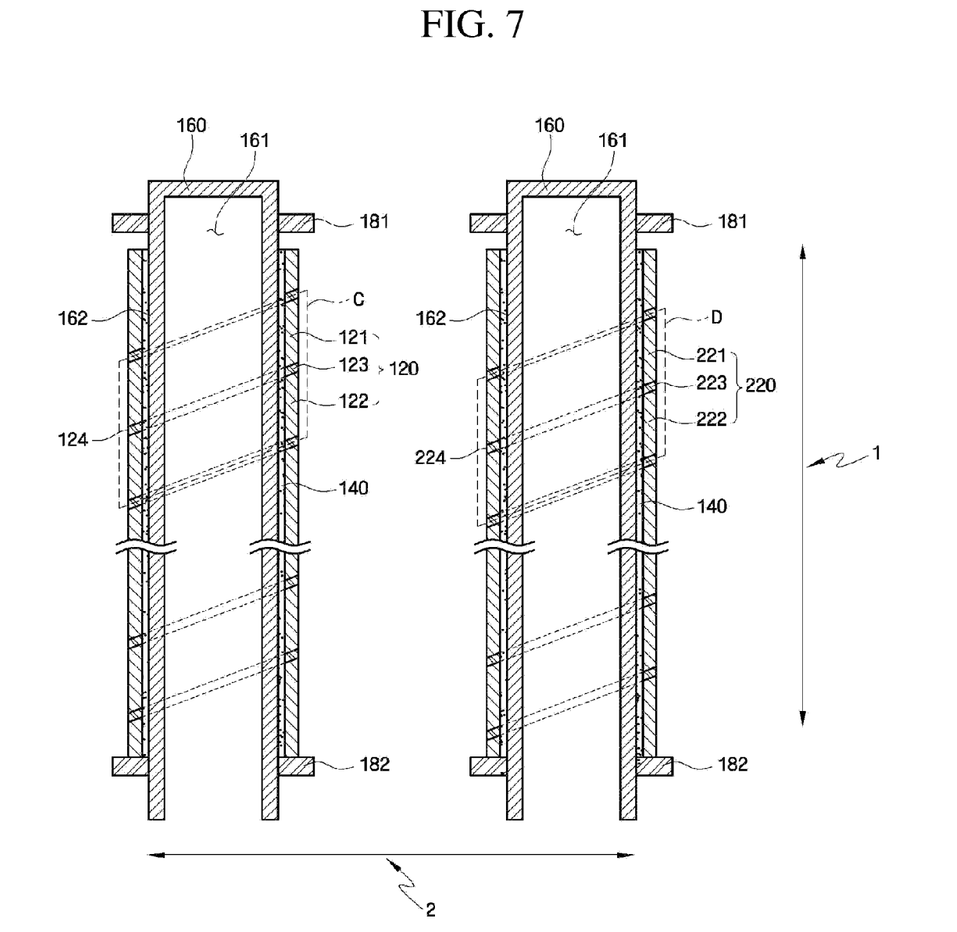
FIG. 7 is a cross-sectional view taken along lines III-III' and IV-IV' of FIG. 6.
Figure 8:
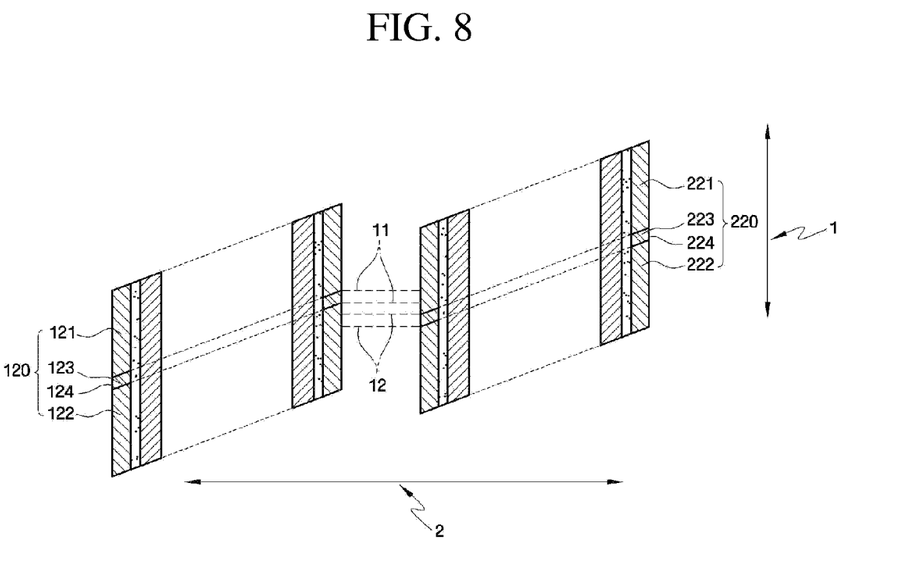
FIG. 8 is an enlarged view of portions "C" and "D" of FIG. 7.

FIG. 6 is a perspective view showing a first target assembly and a second target assembly in a sputtering target apparatus according to another exemplary embodiment of the present invention, FIG. 7 is a cross-sectional view taken along line III-III' and line IV-IV' of FIG. 6, and FIG. 8 is an enlarged view of portion C and portion D of FIG. 7. For convenience of explanation, elements each having the same function for describing the previous embodiment are respectively identified by the same reference numerals and their repetitive description will not be repeated.

Referring to FIG. 6 and FIG. 7, a first target assembly 100 and a second target assembly 200 are disposed adjacent to each other in a second direction 2 that is perpendicular to the first direction 1.

The second target assembly 200 includes a second target array 220 consisting of a third target 221, a fourth target 222 disposed adjacent to the third target 221, and a second target dividing region 223 disposed between the third target 221 and fourth target 222. In this case, the second target array 220 extends parallel to the first target array 120. Since the third target 221, the fourth target 222, and the second target dividing region 223 have substantially the same shapes and materials as those of their counterpart targets and regions illustrated in the first embodiment, a detailed description thereof will not be given.

Referring to FIG. 7 and FIG. 8, a virtual line 11 extending from the first target dividing region 123 in the second direction 2, meets with the third target 221 or the fourth target 223 in the second target array 220. That is, when being moved parallel to the second target array 220 along the second direction 2, the first target dividing region 123 overlaps the third target 221 or the fourth target 222 in the second target array 220.

Likewise, a virtual line 12 extending from the second target dividing region 223 in the second direction 2 meets with the first target 121 or the second target 122 in the first target array 120. That is, when being moved parallel to the first target array 120 along the second is direction 2, the second target dividing region 223 overlaps the first target 121 or the second target 122 in the first target array 120.

The above-described configuration allows uniform deposition of materials contained in the first target 121, the second target 122, the third target 221, the fourth target 222, the bonding agent 124 contained in the first target dividing region 123, and a bonding agent 224 contained in the second target dividing region 223 across the substrate, thereby achieving uniform electrical characteristics across the deposited film.

A sputtering target apparatus according to another exemplary embodiment of the present invention will now be described in detail with reference to FIG. 9, FIG. 10, and FIG. 11.

FIG. 9 is a plan view of a target assembly 300 including first parallelogram-shaped targets and second parallelogram-shaped targets, in a sputtering target apparatus according to another exemplary embodiment of the present invention. FIG. 10 is a first cross-sectional view taken along line V-V' of FIG. 9 according to an exemplary embodiment of the present invention, and FIG. 11 is a second cross-sectional view taken along line V-V' of FIG. 9 according to another exemplary embodiment of the present invention.

Referring to FIG. 9, a third target array 330 includes a first target 331, a second target 332, and a first target dividing region 333 disposed between the first target 331 and the second target 332.

The third target array 330 is affixed onto a planar support 310. The support 310 may be formed of the same material as the rotary roller 160 described above.

Since the shape, size, materials and other features of the first target 331, the second target 332, and the first target dividing region 333 are substantially the same as those of their counterpart targets and regions illustrated in the first exemplary embodiment, a detailed is description thereof will not be given.

Figure 10:
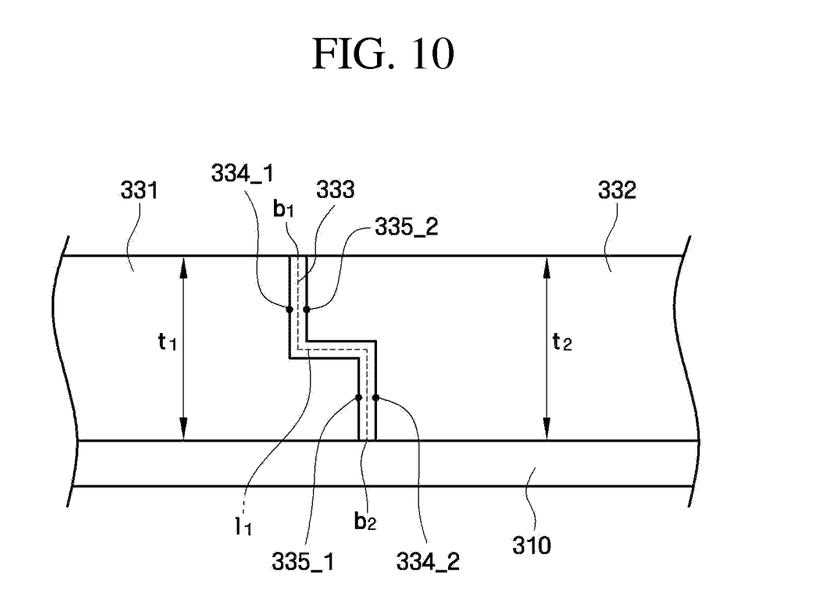
FIG. 10 is a first cross-sectional view taken along line V-V' of FIG. 9.

Referring to FIG. 9 and FIG. 10, the first target dividing region 333 includes a first boundary "b1" and a second boundary "b2".

In this exemplary embodiment, the length "l1" of a path between the first boundary b1 and the second boundary b2 is greater than a thickness "t1" of the first target 331 and a thickness "t2" of the second target 332. Thereby, it is possible to prevent incorporation of a bonding agent (not shown) for bonding the first target 331 to the second target 332 into a thin film being deposited over a substrate. For example, if the bonding agent is indium (In), the sputtering target apparatus according to the present exemplary embodiment can prevent In from being incorporated into a deposited thin film. Thus, according to the present exemplary embodiment, only materials contained in the first target 331 and the second target 332 can be deposited over the substrate, thereby allowing formation of a thin film having superb electrical characteristics. The feature of the present exemplary embodiment can also be applied to the first dividing region 123 and the second target dividing region 223. For convenience of explanation, the feature of the target dividing region is described herein with respect to the present exemplary embodiment in which the first target and the second target are of a planar shape.

Referring to FIG. 10, the first target 331 includes a first concave portion 334_1 and a first protrusion portion 335_1. Likewise, the second target 332 includes a second concave portion 334_2 and a second protrusion portion 335_2.

In this case, in the first target dividing region 333, the first concave portion 334_1 and the first protrusion portion 335_1 are respectively disposed opposite to the second protrusion portion 335_2 and the second concave portion 334_2. Thereby, the length l1 of a path between the first boundary b1 and the second boundary b2 in the first target dividing region 333 becomes is greater than the thickness t1 of the first target 331 and the thickness t2 of the second target 332.

Figure 11:
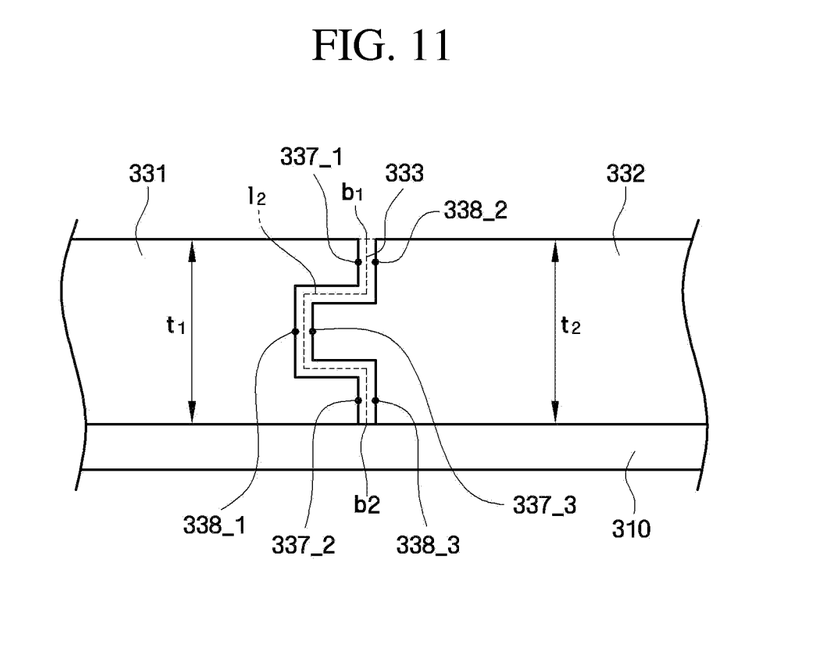
FIG. 11 is a second cross-sectional view taken along line V-V' of FIG. 9.

Referring to FIG. 11, according to another exemplary embodiment of the first target dividing region 333, the first target 331 includes a first convex portion 337_1, a second convex portion 337_2, and a first concave portion 338_1 formed between the first convex portion 337_1 and the second convex portion 337_2. The second target 332 includes a second concave portion 338_2, a third concave portion 338_3, and a third convex portion 337_3 formed between the second concave portion 338_2 and the third concave portion 338_3.

In the first target dividing region 333, the first convex portion 337_1, the second convex portion 337_2, and the first concave portion 338_1 are respectively disposed opposite to the second concave portion 338_2, the third concave portion 338_3, and the third convex portion 337_3. Thereby, the length "l2" of a path between the first boundary b1 and the second boundary b2 in the first target dividing region 333 becomes greater than the thickness t1 of the first target 331 and the thickness t2 of the second target 332.

Figure 12:
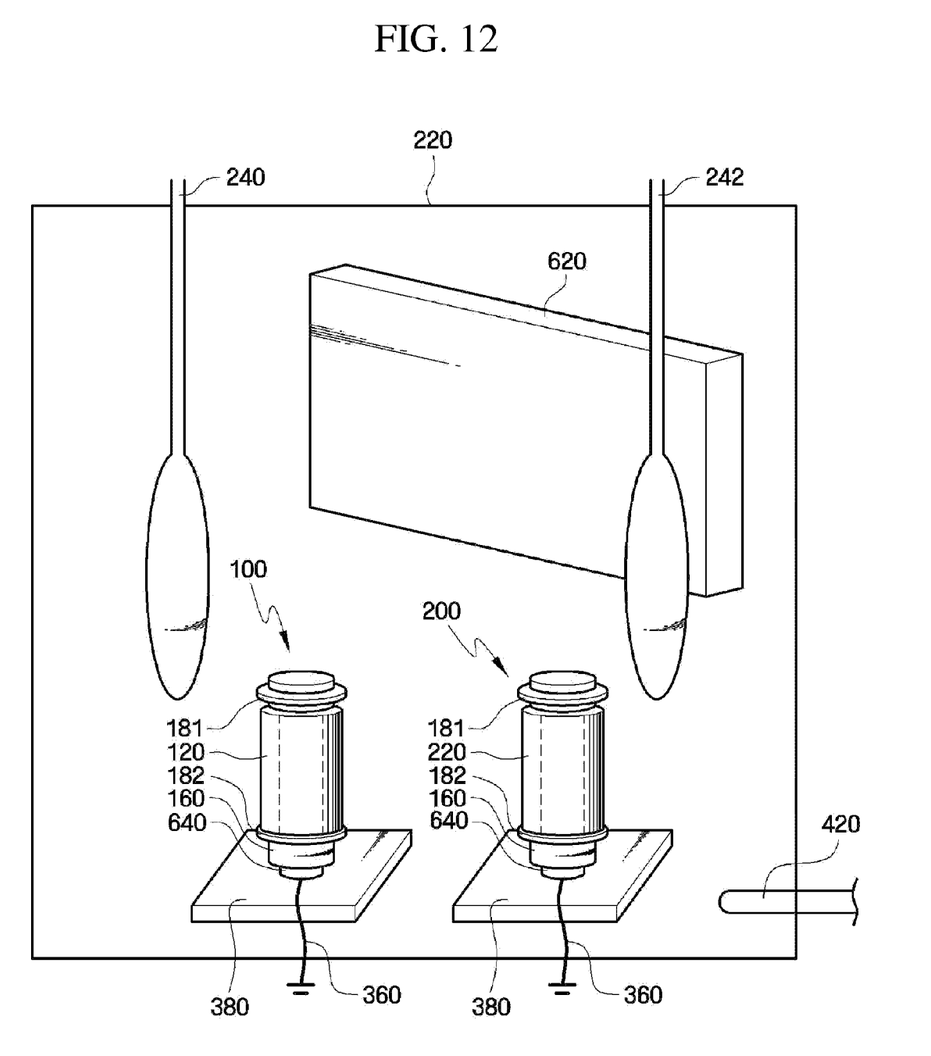
FIG. 12 is a schematic diagram of an exemplary embodiment of a sputtering system wherein the sputtering target apparatus of FIG. 6 is used.

FIG. 12 is a schematic diagram of an exemplary embodiment of a sputtering system wherein the sputtering target apparatus of FIG. 6 is used.

Referring to FIG. 12, a sputtering system according to an exemplary embodiment of the present invention includes a chamber 220 sealed in a high vacuum state, a first target assembly 100, a second target assembly 200, and a substrate support 620.

For the sputtering system, a magnetron sputtering system or any other sputtering system may be used. For convenience of explanation, however, the present invention is described herein with respect to an exemplary embodiment in which a magnetron sputtering system is used.

Within the chamber 220 in which plasma is generated, the first target assembly 100 and the second target assembly 200 are disposed opposite to the substrate support 620. The substrate support 620 and the first target assembly 100 and the second target assembly 200 may be disposed orthogonal to a ground plane, or in other various ways.

As described above, each of the first target assembly 100 and the second target assembly 200 in the sputtering system includes the hollow rotary roller 160 and the first (second) target array 120 (220) disposed along the outer circumference of the rotary roller 160. To perform sputtering, the rotary roller 160 is affixed to a rotation axis 640 connected to a target rotation unit 380.

The chamber 220 further includes an exhaust gas tube 420 that connects with a vacuum pump (not shown) and reduces a gas pressure for sputtering. The vacuum pump and the exhaust gas tube 420 maintain a vacuum state in the chamber 220.

After creating a vacuum inside the chamber 220, sputtering gas is introduced into the chamber 220 via gas supply pipes 240 and 242.

Subsequently, upon application of a negative voltage to the first target assembly 100 and the second target assembly 200 via electrical wires 360, electrons caught along magnetic field lines of a magnet disposed inside the rotary roller 160 generate plasma around the surfaces of the first target array 120 and the second target array 220.

When the generated plasma impinges on the first target array 120 and the second target array 220, materials of the first target array 120 and the second target array 220 are sputtered from the first target array 120 and the second target array 220 and deposited over the substrate mounted on the substrate support 620.

While the present invention has been particularly shown and described with reference to exemplary embodiments thereof, it will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. A sputtering target apparatus, comprising:
a first target assembly extending lengthwise along a first direction, the first target assembly comprising:
a first target array, comprising:
a cylindrical first target;
a cylindrical second target disposed adjacent to the first target; and
an elliptical first target dividing region disposed between the first target and the second target,
wherein the first target dividing region lies entirely within a plane disposed at an oblique angle with respect to the first direction.

2. The sputtering target apparatus of claim 1, wherein a longitudinal cross-section of the second target with respect to the first direction comprises a third boundary and a fourth boundary, and a parallelogram is formed by joining the third boundary and the fourth boundary to virtual lines.

3. The sputtering target apparatus of claim 1, wherein the parallelogram is divided into two right triangles by a virtual dividing line connecting one vertex of the parallelogram with the opposing vertex.

4. The sputtering target apparatus of claim 1, further comprising:
a second target assembly extending lengthwise parallel to the first target array, the second target assembly comprising:
a second target array comprising:
a cylindrical third target;
a cylindrical fourth target disposed adjacent to the third target; and
a second target dividing region disposed between the third target and the fourth target, the second target dividing region having a non-circular elliptical shape and lying entirely within a plane disposed at an oblique angle with respect to the first direction,
wherein the second target assembly is disposed adjacent to the first target assembly in a second direction.

5. The sputtering target apparatus of claim 4, wherein a virtual line extending from the first target dividing region in the second direction intersects the third target or the fourth target while a virtual line extending from the second target dividing region in the second direction intersects the first target or the second target.

6. The sputtering target apparatus of claim 5, wherein the first direction and the second direction are orthogonal to each other.

7. The sputtering target apparatus of claim 1, wherein the first target assembly further comprises a hollow cylindrical rotary roller comprising an outer circumference, and the first target and the second target are affixed to the outer circumference of the rotary roller.

8. The sputtering target apparatus of claim 7, wherein the rotary roller comprises the shape of a hollow cylinder having one end closed.

9. The sputtering target apparatus of claim 7, wherein each of the first target and the second target comprises the shape of a hollow cylinder.

10. The sputtering target apparatus of claim 7, wherein the rotary roller further comprises a support ring affixed to the outer circumference thereof.

11. The sputtering target apparatus of claim 1, wherein each of the first target and the second targets comprises a planar shape.

12. The sputtering target apparatus of claim 1, wherein each of the first target and the second target comprises oxide containing at least one metal selected from the group consisting of zinc (Zn), indium (In), gallium (Ga), and tin (Sn).

13. The sputtering target apparatus of claim 1, wherein the first target dividing region comprises a bonding agent.

14. The sputtering target apparatus of claim 13, wherein the bonding agent comprises indium (In).

15. A sputtering target apparatus, comprising:
a first target assembly comprising:
a first target array extending along a first direction, the first target array comprising:
a cylindrical first target having a planar lower surface;
a cylindrical second target disposed adjacent to the first target; and
a first target dividing region disposed between a planar lower surface of the first target and a planar upper surface of the second target, wherein,
the first target dividing region comprises two boundaries and a length of a path between the two boundaries is greater than a thickness of the first target and a thickness of the second target, and
the lower surface of the first target and the upper surface of the second target are parallel to a plane disposed at an oblique angle with respect to the first direction.

16. The sputtering target apparatus of claim 15, wherein the first target comprises a first convex portion and a first concave portion, and the second target comprises a second convex portion and a second concave portion, and in the first target dividing region, the first convex portion and the first concave portion are respectively disposed opposite to the second concave portion and the second convex portion.

17. The sputtering target apparatus of claim 15, wherein
the first target comprises a first concave portion, a second concave portion, and a first convex portion disposed between the first concave portion and the second concave portion,
the second target comprises a second convex portion, a third convex portion, and a third concave portion disposed between the second convex portion and the third convex portion, and
the first convex portion is disposed opposite to the third concave portion in the first target dividing region.

18. The sputtering target apparatus of claim 15, wherein the first target comprises a bonding agent.

19. The sputtering target apparatus of claim 18, wherein the bonding agent comprises indium (In).

20. The sputtering target apparatus of claim 1, wherein,
the longitudinal cross-section of the first target comprises a first boundary and a second boundary,
a non-rectangular parallelogram is formed by joining ends of the first boundary and the second boundary with virtual lines, and
the first boundary and the second boundary are located on the outer circumference of the first target.

21. The sputtering target apparatus of claim 15, wherein,
a longitudinal cross-section of the first target comprises a first boundary and a second boundary,
a non-rectangular parallelogram is formed by joining ends of the first boundary and the second boundary with virtual lines, and
the first boundary and the second boundary are located on the outer circumference of the first target.

* * * * *